United States Patent [19]
Hashimoto

[11] Patent Number: 5,745,241
[45] Date of Patent: Apr. 28, 1998

[54] METHOD OF RECOGNIZING CYLINDRICAL PART

[75] Inventor: Kazuhisa Hashimoto, Iwata, Japan

[73] Assignee: Yamaha Hatsudoki Kabushiki Kaisha, Iwata, Japan

[21] Appl. No.: 555,521

[22] Filed: Nov. 9, 1995

[30] Foreign Application Priority Data

Nov. 11, 1994 [JP] Japan ................................ 6-278137

[51] Int. Cl.$^6$ ..................................................... G01B 11/00
[52] U.S. Cl. ........................ 356/384; 356/385; 356/375; 250/559.24
[58] Field of Search ........................ 356/375, 384, 356/385, 386, 387; 250/559.24; 29/720, 721, 739, 759, 740, 741, 746, 833, 884

[56] References Cited

U.S. PATENT DOCUMENTS 4,867,569  9/1989  Mohara ................................. 356/375

FOREIGN PATENT DOCUMENTS

| 0582086 | 2/1994 | European Pat. Off. . |
| 0597447 | 5/1994 | European Pat. Off. . |
| 6-244592 | 9/1994 | Japan . |
| 7-7297 | 1/1995 | Japan . |

OTHER PUBLICATIONS

European Search Report dated Jan. 26, 1996.

*Primary Examiner*—F. L. Evans
*Attorney, Agent, or Firm*—Knobbe, Martens, Olson & Bear LLP

[57] ABSTRACT

A method and apparatus for measuring cylindrical sections of small components that are to be positioned on a substrate so as to permit accurate mounting thereof. An optical sensing arrangement using a light source is employed, and the pick-up device is treated so as to be nonreflective. In addition, the head has a holder for detachably accepting the various types of pick-up devices and accurately positioning them.

31 Claims, 10 Drawing Sheets

METHOD OF RECOGNIZING CYLINDRICAL PART

BACKGROUND OF THE INVENTION

This invention relates to a method and apparatus for positioning small components and particularly components which have a cylindrical section.

There is a wide use for apparatus that is capable of picking up small components from a supply location and placing them at an accurate location on a surface, such as a substrate like a printed circuit board or the like. These components are usually picked up by some form of pick-up device, frequently a vacuum nozzle, and are transported when so held and subsequently positioned. The components are generally supplied in tape feeder sections, and the components are contained within small recesses formed in a feeder tape. This mechanism does not afford total accuracy in the location of the component relative to the pick-up device at the time the component is picked up.

There have been proposed, therefore, a number of types of mechanisms and methods by which this incorrect mounting may be either corrected or compensated for. One type of system employs a locating arrangement wherein the pick-up device and component is positioned in a locator, which will shift the component relative to the pick-up device into an accurate location. These types of devices have a number of disadvantages. The primary disadvantage is that they must contact the component and move it, and this can be detrimental or can cause the component to become dislodged from the pick-up device.

There have been proposed, therefore, devices that actually will perform a measurement on the component and from that measurement calculate the necessary corrective factors so that the component can be placed in the appropriate position. One such arrangement is shown and described in U.S. Pat. No. 5,384,956, entitled "Method For Mounting Components," issued Jan. 31, 1995, and assigned to the assignee hereof. That type of system and method is extremely effective; however, it is designed primarily for the sensing of either polygonal or rectangular shaped components, including square components. The methodology described in that application is not particularly adapted for use with articles that have a cylindrical configuration, as is true with many types of components which must be so manipulated and placed.

It is, therefore, a principal object of this invention to provide an improved method and apparatus for determining the corrective factors to permit accurate positioning of cylindrical articles.

It is another object of this invention to provide a method and apparatus that permits non-contact measurement of displacements in pick-up position of cylindrical objects.

The apparatus utilized for making these determinations in pick-up position frequently employ light sensing mechanisms. For example, the type of apparatus disclosed in the aforenoted U.S. Pat. No. 5,384,956 utilizes a laser light source that casts a plurality of parallel, relatively discrete light rays across a sensor station in which the component is positioned. A light receptor, such as a CCD array, is disposed on the opposite side of the sensor. Hence, the positioning of the component between the light source and the CCD will cause a shadow to be cast on the CCD. This shadow and its movement and change in size is measured to provide the information necessary to make the corrective calculations.

With this type of mechanism utilizing light rays, it is obviously important that the CCD does not receive extraneous light rays that could cause false readings. This problem is particularly acute if the pick-up device is of such a configuration that it itself can act as a mirror or reflector and cause deflection of the light rays.

It is, therefore, a still further object of this invention to provide an improved pick-up device wherein the device is treated in such a way that it cannot adversely affect the results of optical detection.

These types of mechanisms also frequently are provided with a pick-up head that is adapted to detachably mount a number of different types of pick-up devices. For example, when using vacuum pick-up devices, a number of different types of pick-up nozzles having different configurations can be detachably mounted in the same head. Oftentimes the apparatus is designed so as to automatically replace the nozzle with an appropriate nozzle for the type of component which will be picked up. Thus, it is frequently the practice to employ detachable connections between the actual pick-up device and its supporting mechanism.

The introduction of such detachability, although adding to the versatility of the machine, gives rise to possible errors. That is, the detachable connection should be such that, regardless of the pick-up device which is utilized, it will at all times and all such units will be accurately located in the remainder of the mechanism.

It is, therefore, a further object of this invention to provide an improved detachable coupling structure between a pick-up device and its mounting head that will ensure accuracy in all axes and in its rotational orientation.

SUMMARY OF THE INVENTION

A first feature of this invention is adapted to be embodied in a method and apparatus for picking up and positioning articles having at least one cylindrical section in an accurate location. The apparatus is comprised of a pick-up device that is rotatable about an axis and which is movable in the X, Y, and Z directions to manipulate a picked up article. The pick-up device is adapted to releasably hold the article so that it can be picked up and deposited.

In accordance with an apparatus for practicing the invention, means are provided for taking a first measurement of the cylindrical portion of the article when held by the pick-up device in a first angular position. Means are provided for rotating the pick-up device and the held article through a predetermined angle and taking a second measurement on the cylindrical portion in the second angular positions. Means calculate an X and Y offset as well as a rotational corrective factor from these measurements to determine the offset of the picked up article relative to the pick-up device.

In accordance with a method for practicing the invention utilizing an apparatus as described, a first measurement of the cylindrical part of the article is taken when the pick-up device is held in a first rotary position. The pick-up device and held article are then rotated through a predetermined angle. A second measurement of the cylindrical portion is then taken in this second angular position. From these two angular measurements and knowing the angle through which the part has been rotated, the X, Y, and rotational offsets are calculated.

Another feature of the invention is adapted to be embodied in an apparatus for picking up and positioning articles that includes a pick-up device and a sensing station in which a light source is provided for an optical sensing of the picked up article. The pick-up nozzle is treated in such a way so as to render it nonreflective so that stray light rays from the pick-up device will not interfere with the measurement.

A still further feature of the invention is also adapted to be embodied in an apparatus for picking up and positioning articles using any of a wide variety of types of pick-up devices. The apparatus includes a detachable mounting part that is defined by a pair of rigid, angularly related surfaces, each of which is faced by a spring clip having a tab end that is adapted to engage in a recess in the pick-up device to provide axial location of the pick-up device and to urge flat surfaces of the pick-up device into engagement with the flat surfaces of the mounting portion. The mounting portion also has another surface that extends transversely to its rigid surface and which restrains the pick-up device in a direction perpendicular to these surfaces.

DETAILED DESCRIPTION OF THE PREFERRED EMBODIMENTS OF THE INVENTION

Figure 1:
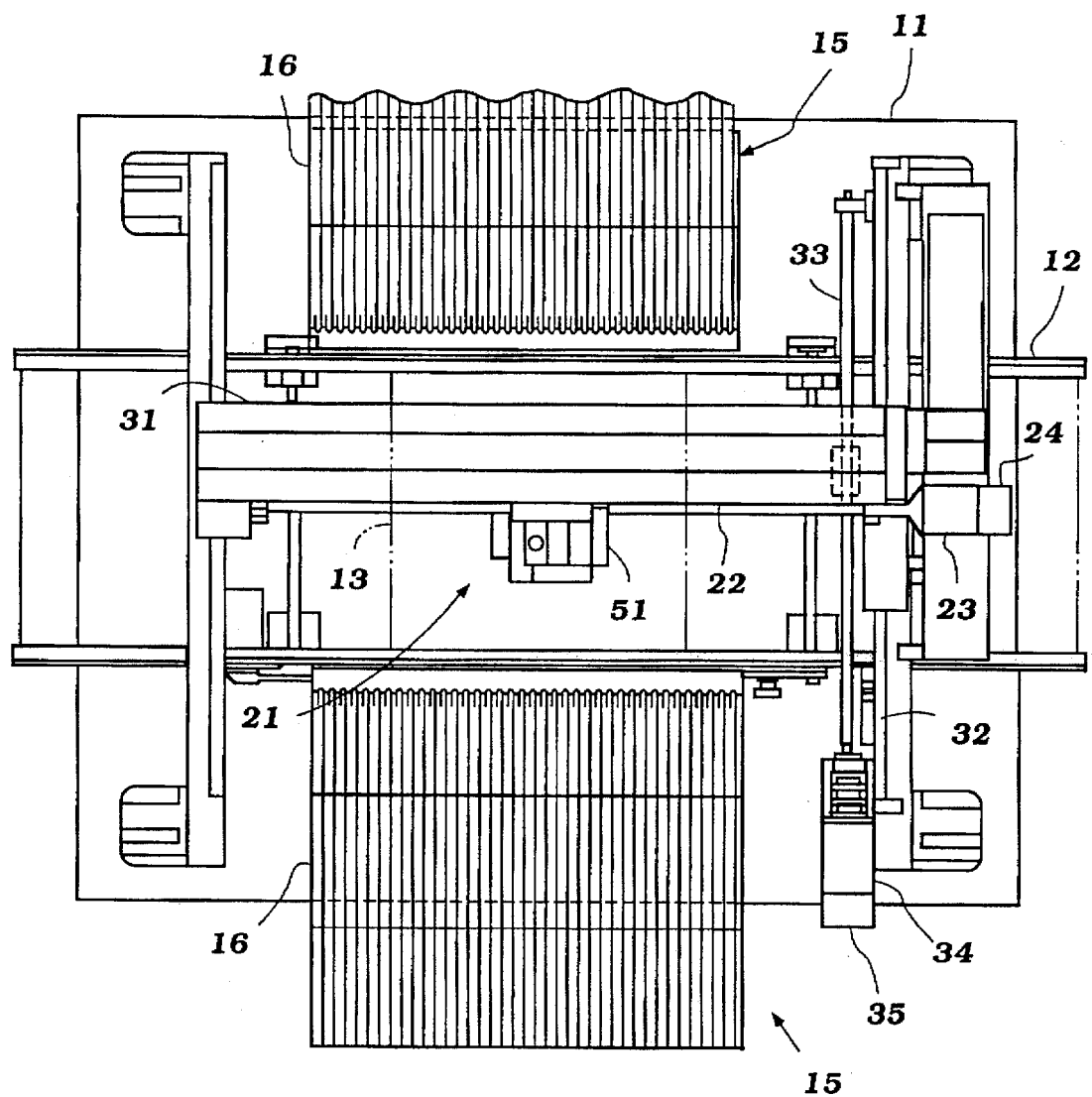
FIG. 1 is a top plan view of a component mounting apparatus constructed and operated in accordance with an embodiment of the invention.
Figure 2:
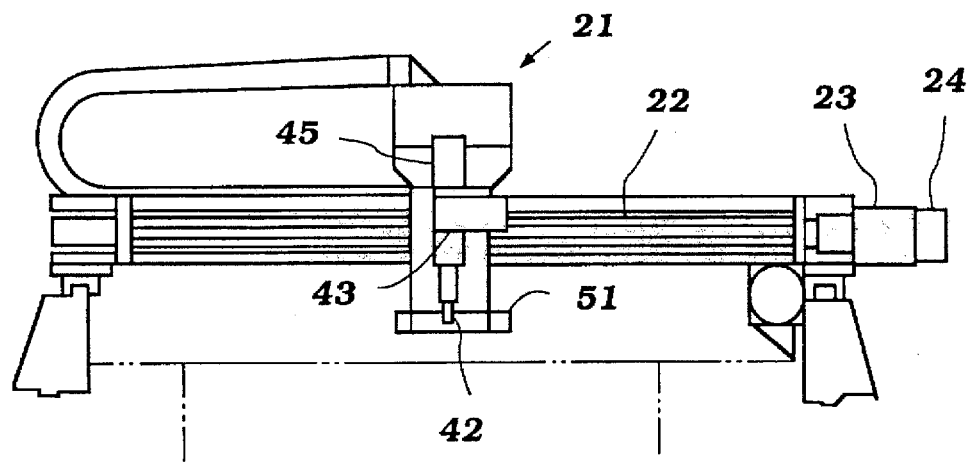
FIG. 2 is a front elevational view of the component mounting apparatus.
Figure 3:
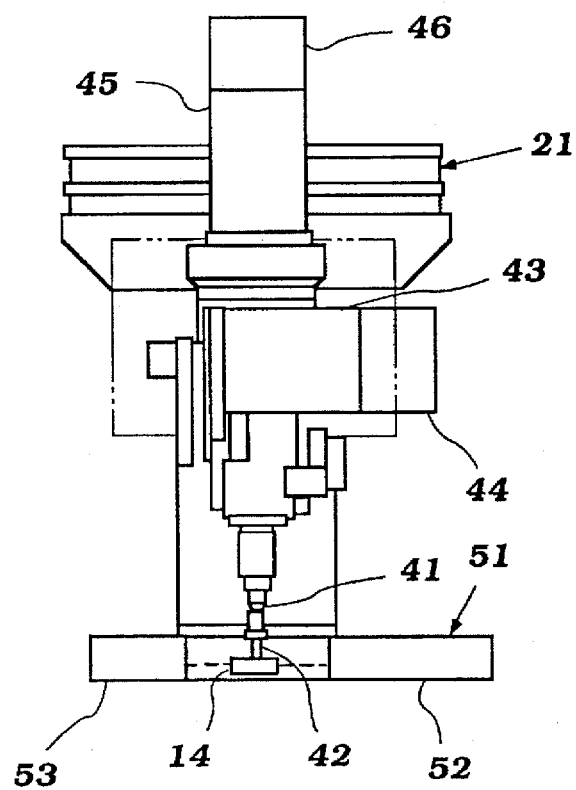
FIG. 3 is an enlarged front elevational view of the component mounting apparatus with a component picked up and positioned in the sensing station.

Referring now to the drawings and initially to FIGS. 1 through 3, a mounting apparatus constructed in accordance with an embodiment of the invention is indicated generally by the reference numeral 11. The mounting apparatus 11 cooperates with a conveyor section 12 on which substrates 13 such as printed circuit boards or the like are presented to the mounting apparatus 11. Individual components 14 at least some of which have cylindrical sections are selected, in a manner to be described in detail later, from parts supply areas 15 disposed on opposite sides of the conveyor 12 and which each comprise a plurality of tape feeders 16 which sequentially present a plurality of different types of components 14, including those of the aforenoted type, for selection and mounting in a manner to be described.

The mounting apparatus 11 includes a head unit 21 which is mounted for movement in an "XX" direction by means including a feed screw 22. The feed screw 22 is driven by a servo motor 23 which has coupled to it an encoder 24 that provides a signal indicative of the rotation of the feed screw 22 and accordingly the position of the head unit 21 along the "XX" axis.

The mechanism as thus far described is all mounted on a support member 31 which support member is, in turn, supported for movement in the "YY" direction on a pair of spaced apart guide rails 32 that are disposed at opposite ends of the mounting apparatus 11 and which extend in the "YY" plane.

A feed screw 33 is rotatably journaled by one of the guide rails 32 and cooperates with a nut carried by the support member 31. The feed screw 33 is driven by a servo motor 34 which has coupled to it an encoder 35 that provides a signal indicative of the rotation of the feed screw 33 and accordingly the position of the head unit 21 along the "YY" axis.

A pick-up head, indicated generally by the reference numeral 41, is mounted on the head unit 21 for picking up components from the tape feeders 16, orienting them correctly, and positioning and mounting them on a substrate 13 presented by the conveyor 12. In the illustrated embodiment, the pick-up head 41 is depicted as being of the vacuum type and includes a pick-up nozzle 42. It is to be understood that the invention may be employed with different types of pick-up device, however, the invention has particular utility with vacuum type devices.

Each pick-up head 41 and its associated pick-up nozzle 42 is supported for movement both in an axial direction along the "ZZ" axis and for rotary motion about an axis coincident with the pick-up head 41 and identified by the "R" axis in a suitable manner.

Movement in the "ZZ" direction is controlled by a servo motor 43 that drives the pick-up nozzle 42 between its lowered and raised positions and which is coupled to an encoder or position sensing device 44 so as to determine the location of the pick-up nozzle 42 in the "ZZ" direction. Rotary motion about the "R" axis is accomplished by means of a servo motor 45 so as to provide a position signal indicative of the angular position θ about the "R" axis. An optical measuring device 51, such as one including a laser, is mounted on the lower portion of the pick-up head 41 and cooperates with the pick up-head 41. This optical device includes a laser light source 52 that emits a plurality of parallel light rays, some which are obstructed by the picked up component, on to a photo receptor 53 such as a CCD. As may be seen in FIG. 4, the laser measuring device 51 is connected to a laser processor 61 that outputs and receives signals from an input/output means 62 for a purpose that will be described.

Figure 4:
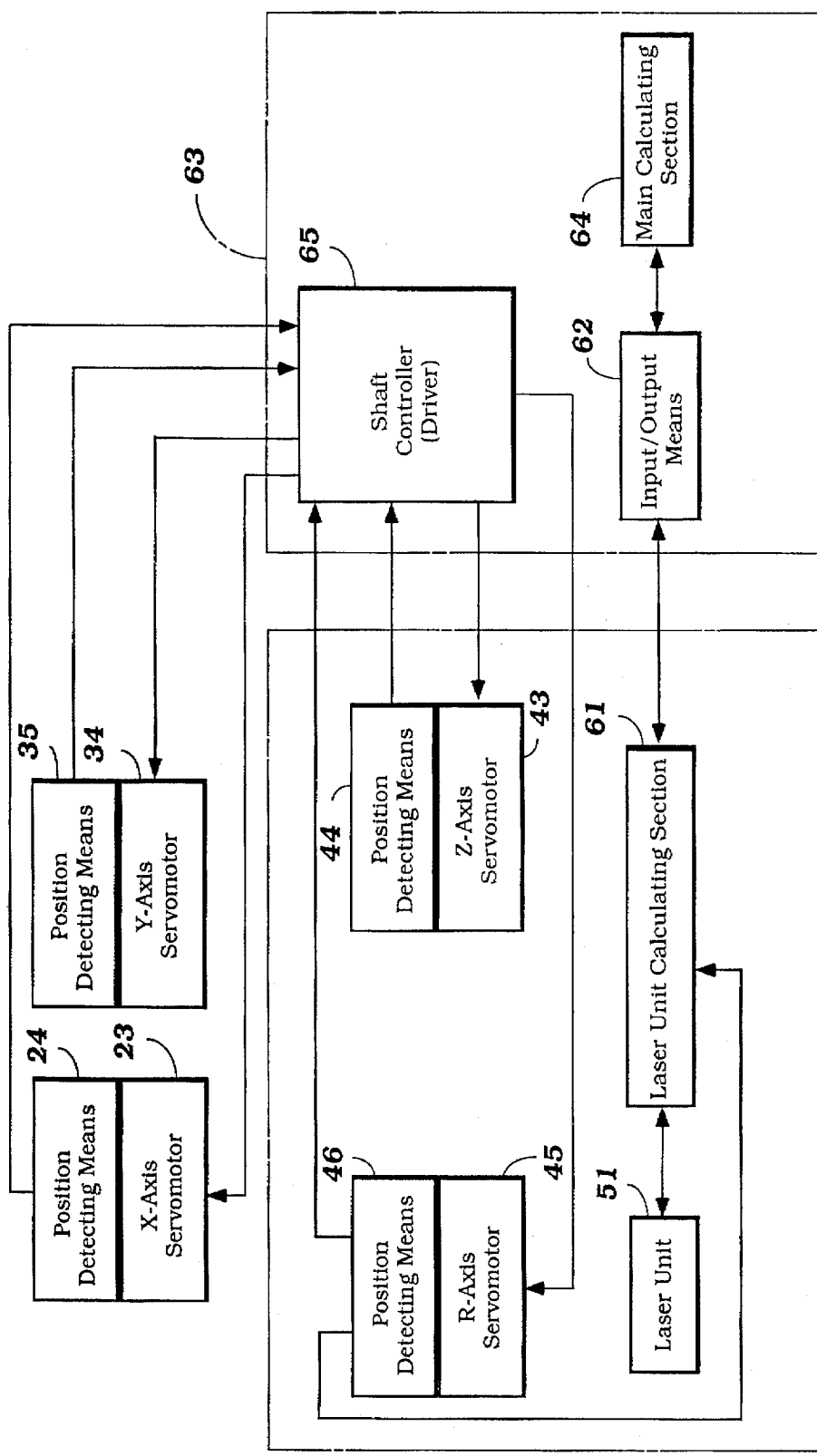
FIG. 4 is a block diagram showing the various components of the apparatus and their interrelationship.

Referring now specifically to FIG. 4, the system is provided with a main controller indicated by the reference numeral 63 which includes in addition to the input/output means 62, a main processor 64 that provides the control sequence which will be described. This main processor 64 controls the transmission of signals from the input/output means 62 and provides access control to a shaft controller 65 which will set the various positions of the components, as will now be described.

Figure 5:
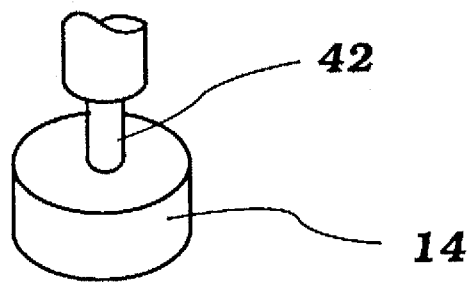
FIG. 5 is a perspective view of a component that has been picked up by the pick-up nozzle.

The method by which the apparatus operates so as to pick up cylindrical components and position them appropriately on the substrate 13 will now be described with particular reference to FIGS. 5 through 11. FIG. 5 shows a cylindrical component 14 having been picked up by the pick-up nozzle 42 from one of the tape feeders 16. These tape feeders 16 present the cylindrical and other components 14 to be picked up by the pick up-head 41 and specifically the pick-up nozzle 42 to be moved to an appropriate position and oriented so as to be mounted on the substrate 13.

It should be noted that the cylindrical components 14 fed at the tape feeders 16 although being oriented in a certain relationship, are not accurately positioned in the necessary orientation. That is, the cylindrical components 14 are normally contained in pockets in the tape and although those pockets are sized so as to orient the cylindrical components 14 in a particular relationship, they may be displaced along the "X" and "Y" axes and rotationally from the rotational axis "R" and center of the pick-up nozzle 42.

Therefore, the device functions so as to pick up the cylindrical components 14 from the tape feeder 16 and determine the orientation of the point of pick up and the cylindrical component 14 relative to the pick-up nozzle 42.

Figure 6:
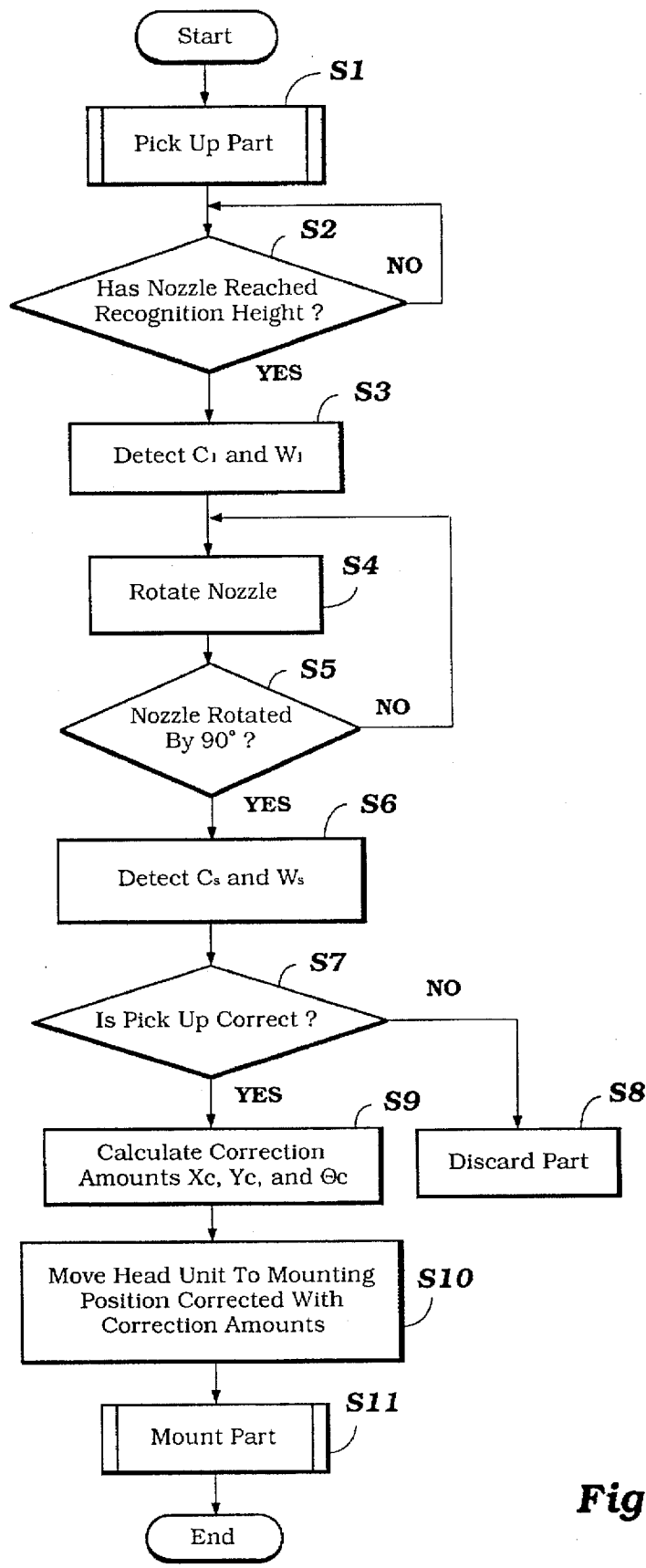
FIG. 6 is a block diagram showing a control routine in accordance with a method by which the apparatus operates.
Figure 7:
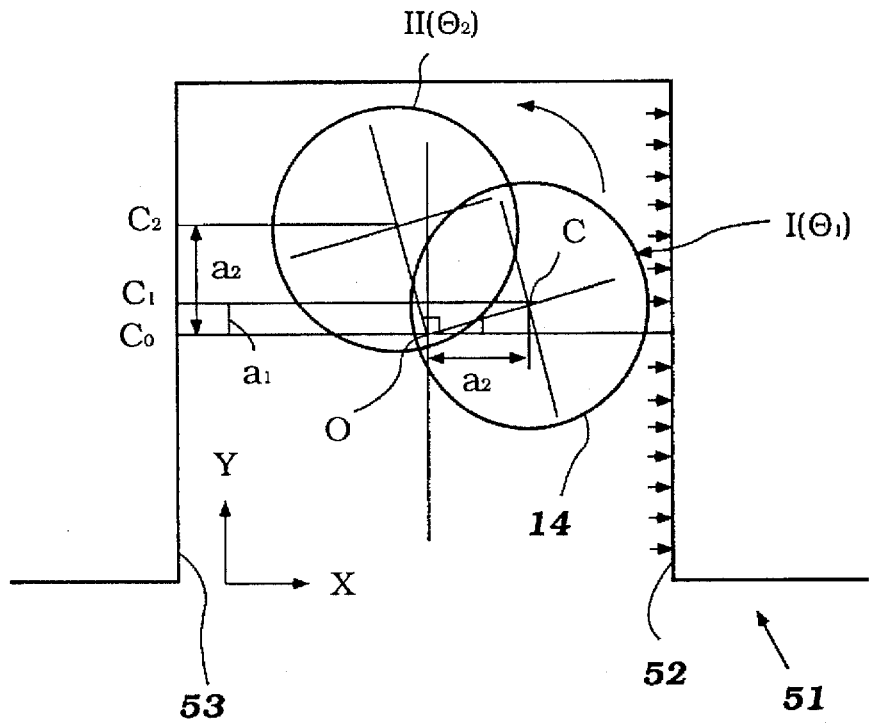
FIG. 7 is a top plan view showing a manner in which the measurements of the component length are obtained by the detecting apparatus.

This operation is now described with reference initially to FIGS. 6 and 7. When the program starts it moves to step S1 in which the cylindrical component 14 is picked up from the tape feeder 16. The mounting head and pick-up nozzle 42 are moved by the various servo motors 23, 34 and 43 to an appropriate position over the tape feeder 16 in which the component 14 is positioned. The head 41 and pick-up nozzle 42 are then lowered to pick up the component 14 with the vacuum source energized.

The component 14 is then attracted and held by the pickup nozzle 42, which then raises the cylindrical component 14 to a particular height that is in vertical alignment with the laser 51 as determined in step S2. If at step S2 it is determined that the cylindrical component 14 is not yet in vertical alignment with the laser 51 the step repeats until such time as the cylindrical component 14 is in the desired vertical position.

The operation now moves to step S3 which determines the position and width of the cylindrical component 14 based on the shadow it casts on the photo receptor 53. The pick-up nozzle 42 is set to some arbitrary rotary angle $\theta_1$ as shown in FIG. 7. At this pick-up nozzle orientation, the cylindrical component 14 will intersect a portion of the light rays from the laser generator 52 and cast a shadow on the photo receptor 53 from which the cylindrical component's width "W1" and center "C1" are determined for the $\theta_1$ orientation. The center C is assumed as the midpoint of the width.

The pick-up nozzle 42 is next rotated in step S4 through a known, predetermined angle, such as ninety degrees, through an angle $\theta_2$. Once it has been determined in step S5 that the pick-up nozzle 42 has been fully rotated to the $\theta_2$ position, the program moves on to step S6 where the cylindrical component's width "W2" and center "C2" are determined for the orientation $\theta_2$ in the same manner as that employed in step S3.

In step S7 it is determined if the cylindrical component 14 has been picked up correctly by the pick-up nozzle 42. If this is so then "W1" should be equal to "W2" and both should correspond to the known diameter of the cylindrical component 14. If this is not so the cylindrical component 14 is discarded in step S8. Otherwise, the program advances to step S9.

In step S9 the cylindrical component's mounting position correction factors are calculated and the rotary angle $\theta_c$ of the pick-up nozzle 42 when the cylindrical component 14 was picked up is determined. With reference to FIG. 7 it is seen that when the cylindrical component 14 is at the $\theta_1$ orientation its center "C1" is displaced a distance "$a_1$" along the "Y" axis from the pick up nozzle center "O". When the cylindrical component 14 is at the $\theta_2$ orientation its center "C2" is displaced a distance "$a_2$" along the "Y" axis from the pick up nozzle center "O". This distance "$a_2$" corresponds to the "X" axis displacement of cylindrical component center "C1" relative to the pick-up nozzle center "O" when the cylindrical component 14 is at the $\theta_2$ orientation. Thus, the correction factors "Xc" and "Yc" are determined to be "$a_2$" and "$a_1$" respectively for the cylindrical component 14 when at the "$\theta_c$" orientation.

With the correction factors determined, the program moves to step S10 where the head unit 21 is moved to a mounting position that factors in the correction factors for the cylindrical component 14, which is subsequently mounted onto the substrate 13 in step S11. This terminates the program.

Figure 8:
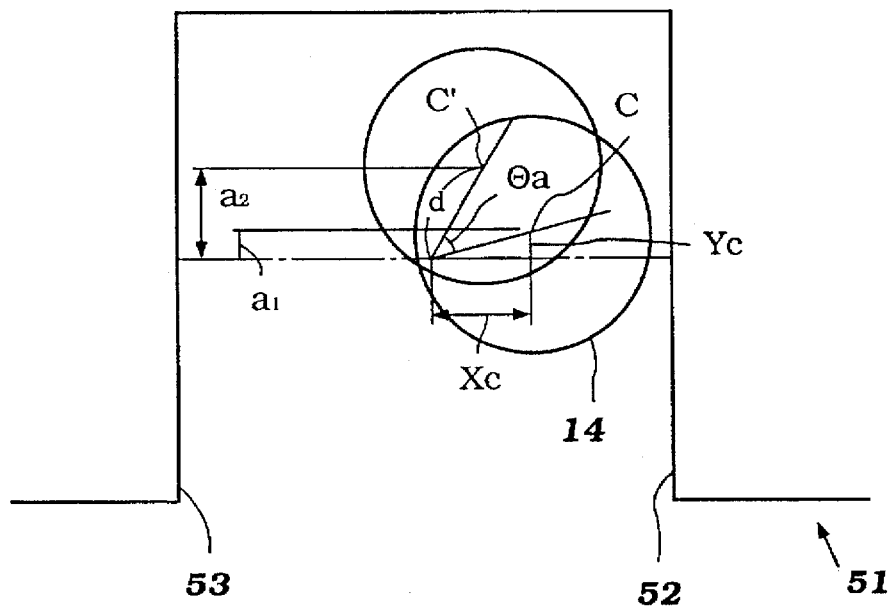
FIG. 8 is a top plan view, in part similar, to FIG. 7 showing further how the measurements and calculations are made.

In the above example, the angle between "$\theta_1$" and "$\theta_2$" is ninety degrees. While it is convenient to use an angle of ninety degrees it is by no means required to do so. FIG. 8 illustrates a mounting operation where a known arbitrary angle "$\theta_a$" separates the "$\theta_1$" and "$\theta_2$" orientations. The cylindrical component 14 is initially positioned at the "$\theta_1$" orientation, where it is disposed at an angle $\gamma$ from the "X" axis. At this orientation the pick up nozzle center "O" is at an unknown distance "d" away from the center "C" of the cylindrical component 14 and a trigonometric relationship exists whereby:

$$a_1 = d \sin\gamma \qquad \text{Eq. 1}$$

where "$a_1$" is a known distance determined by the mounting program in step S3 and corresponds to the "Y" axis correction factor ("Yc" in FIG. 8).

When the cylindrical component 14 is rotated through the arbitrary angle "$\theta_a$" to the "$\theta_2$" orientation by the pick-up nozzle 42 the nozzle center "O" is at the same unknown distance "d" from the new cylindrical component center "C'". At the "$\theta_2$" orientation, a relationship exists whereby:

$$a_2 = d \sin(\gamma + \theta_a) \qquad \text{Eq. 2}$$

which is mathematically equivalent to:

$$a_2 = d \sin(\gamma)\cos(\theta_a) + d \cos(\gamma)\sin(\theta_a) \qquad \text{Eq. 2a}$$

It is desired to determine the value for the "X" axis correction factor "Xc" which from FIG. 8 is seen to be:

$$Xc = d \cos(\gamma) \qquad \text{Eq. 3}$$

where "d" and "$\gamma$" are both unknown.

Substituting Eq. 3 into Eq. 2a yields:

$$a_2 = d (\theta_a) + Xc \sin(\theta_a)$$

where from Eq. 1 d $\sin(\theta_a) = a_1$.

Thus:

$$a_2 = a_1 \cos(\theta_a) + Xc \sin(\theta_a)$$

Solving for "Xc" yields:

$$Xc = [a2 - a1 \cos(\theta_a)]/\sin(\theta_a)$$

Thus, both correction factors are determined and the head unit 21 may once again accurately mount the cylindrical component 14 to the substrate 13.

Figure 9:
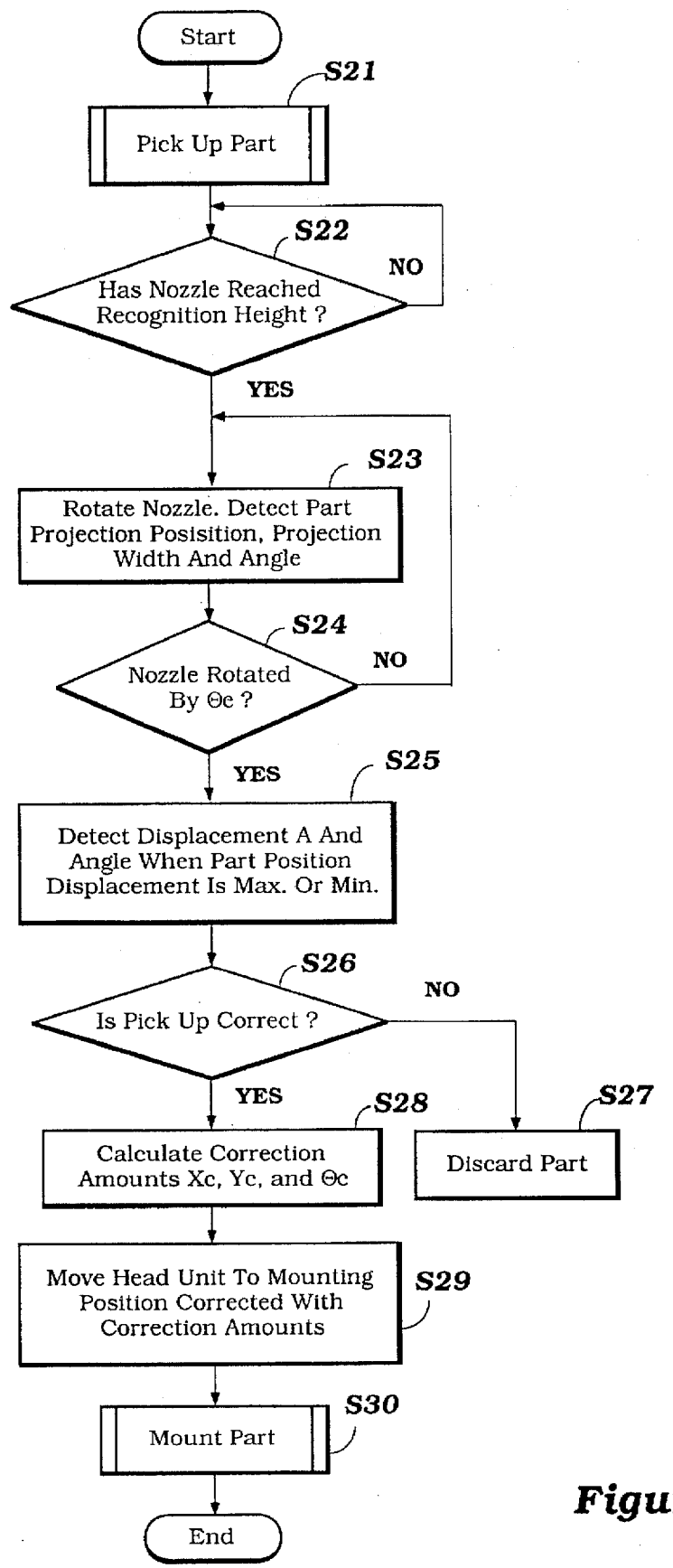
FIG. 9 is a block diagram showing a control routine in accordance with a further method by which the apparatus operates.
Figure 10:
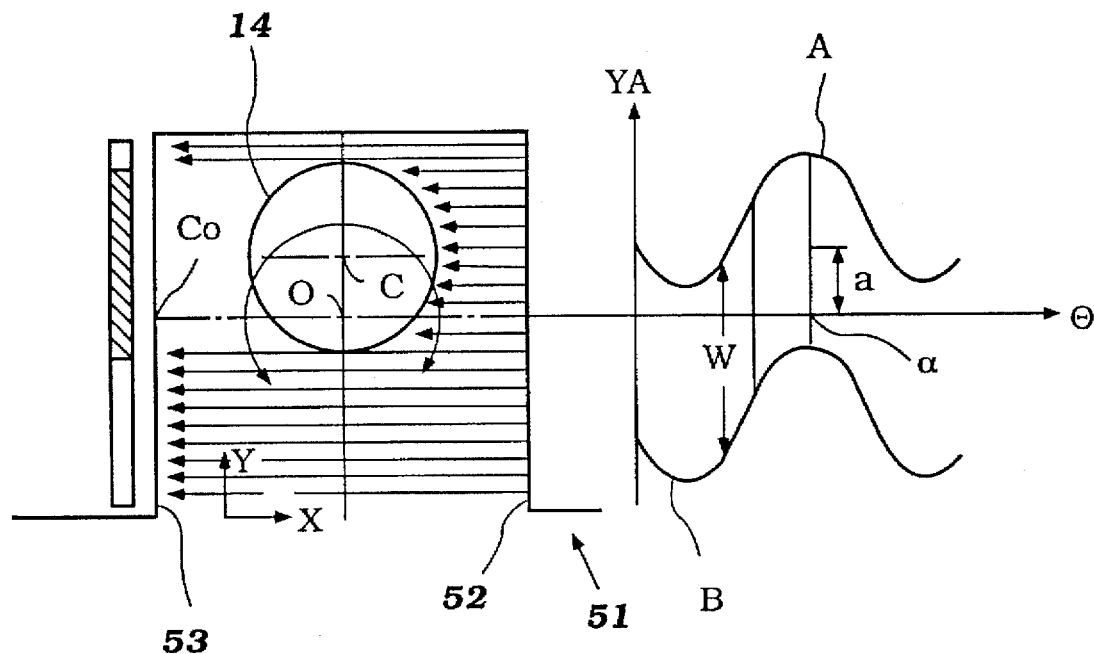
FIG. 10 is a top plan view similar to FIG. 7 and showing the measurements utilized with the embodiment of FIG. 9 and the resulting measurements therefrom.

A further method for calculating the correction factors "Xc" and "Yc" is executed by the program shown in FIG. 9, which is similar to the earlier program but differs in that the cylindrical component 14 is rotated by the pick-up nozzle 42 some angle $\theta_e$ (for example, 180 degrees) and the point in the rotation where the maximum (or minimum) displacement between the pick up nozzle center "O" and the cylindrical component center "C" as shown in FIG. 10 is determined.

When the program starts, it moves to step S21 in which the cylindrical component 14 is picked up from the tape feeder 16 by the pick-up nozzle 42 and raised to a particular height that is in vertical alignment with the laser 51 as determined in step S22. If at step S22 it is determined that the cylindrical component 14 is not yet at the desired vertical position the step repeats until such time as when the cylindrical component 14 is positioned in vertical alignment with the laser 51.

The program next moves to step S23 which rotates the pick-up nozzle 42 through the angle $\theta_e$ and incrementally determines the width "W" and center position "C" of the cylindrical component 14 at every small rotary angle up to where the pick-up nozzle 42 has been rotated $\theta_e$ degrees as determined in step S24.

The program then moves to step S25 which, from the data recorded in step S23, determines the maximum (or minimum) displacement "a" between the nozzle center "O" and the cylindrical component center "C" and the rotary angle $\alpha$ at which this displacement occurred.

In step S26 it is determined if the cylindrical component 14 has been picked up correctly by the pick-up nozzle 42. If the measured cylindrical components widths "W" vary between given angular measurements or fail to correspond to the known diameter of the cylindrical component 14 the cylindrical component 14 will be discarded in step S27. Otherwise the program advances to step S28.

In step S28 the correction factors "Xc" and "Yc" are determined based on the displacement amount "a" and rotary angle $\alpha$ found in step S25. From FIG. 10 it is seen that the variation of "a" with respect to a is represented by a sine wave. The maximum value for "a" is, therefore, at an angle $\alpha$ where the amplitude of the sine wave it at a maximum. At this angle $\theta_c$ the distance "a" corresponds to the "Y" axis correction factor "Yc" and the "X" axis correction factor "Xc" is zero.

With the correction factors "Xc" and "Yc" determined, the program moves to step S29 where the head unit 21 is moved to a mounting position that factors in the correction amounts for the cylindrical component 14 which is then mounted onto the substrate 13 in step S30, which ends the program.

Figure 11:
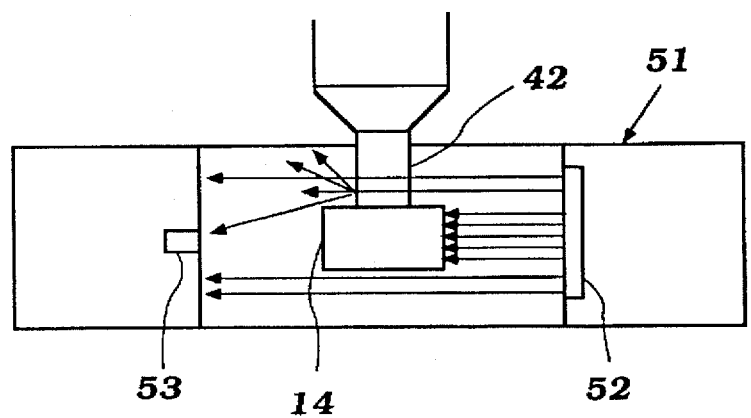
FIG. 11 is a side elevational view of the component mounting apparatus with a component picked up and positioned in the measuring station and illustrating the problems with prior art constructions.

The pick-up nozzle 42 will now be discussed in more detail. As can be seen in FIG. 11 during the execution of the cylindrical component mounting program the pick-up nozzle 42 is exposed to the light rays emitted by the laser generator 52. The possibility therefore exists that the pick-up nozzle 42 can itself act as a mirror or reflector and cause some of the light rays to deflect, which would result in a false reading for the position or width of the cylindrical component 14. This possibility is eliminated by finishing the pick-up nozzle outer surface with a matted paint or forming the pick-up nozzle 42 with black resin or any other suitable nonreflective material.

Oftentimes, the pick-up head 41 is of a design that permits the employment of different types of pick-up devices. When using vacuum type pick-up devices a number of different nozzle configurations can be employed to accommodate mounting components of a diverse nature. Since different types of nozzles may be employed it becomes necessary that the nozzle be detachably mounted to the pick-up head 41. However, this attachment still must be precise and rigid to ensure that the mounting cylindrical components 14 are positioned accurately and firmly on the substrate 13. A method by which this is accomplished is described below.

Figure 12:
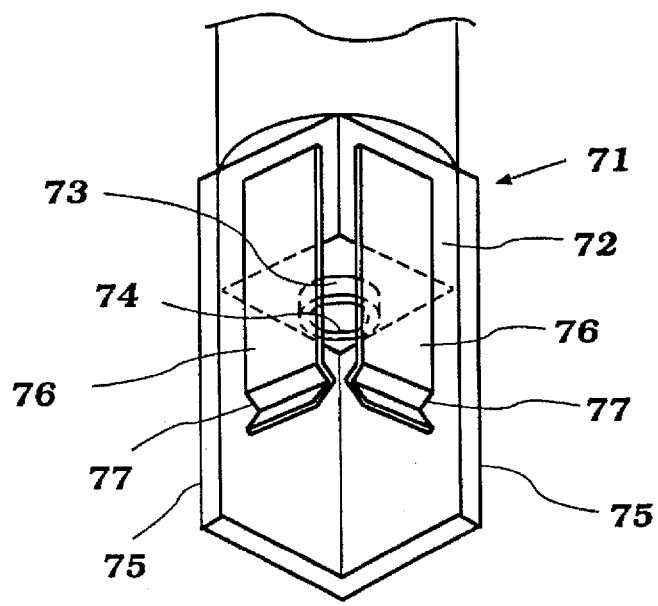
FIG. 12 is a perspective view showing a nozzle holding assembly constructed in accordance with an embodiment of the invention.
Figure 13:
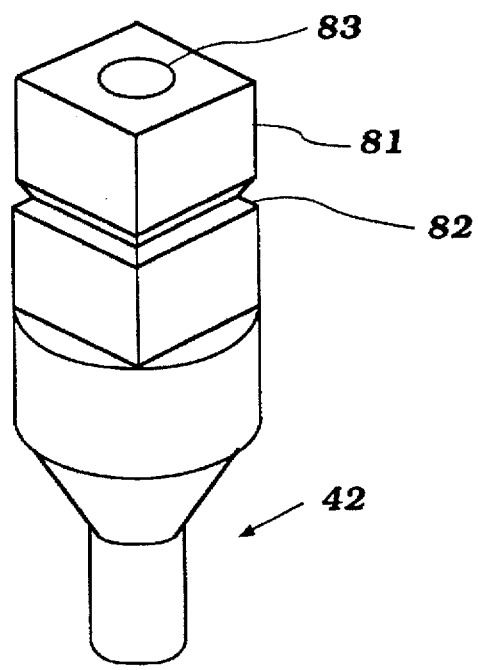
FIG. 13 is a perspective view showing a pick-up nozzle constructed in accordance with an embodiment of the invention.
Figure 14:
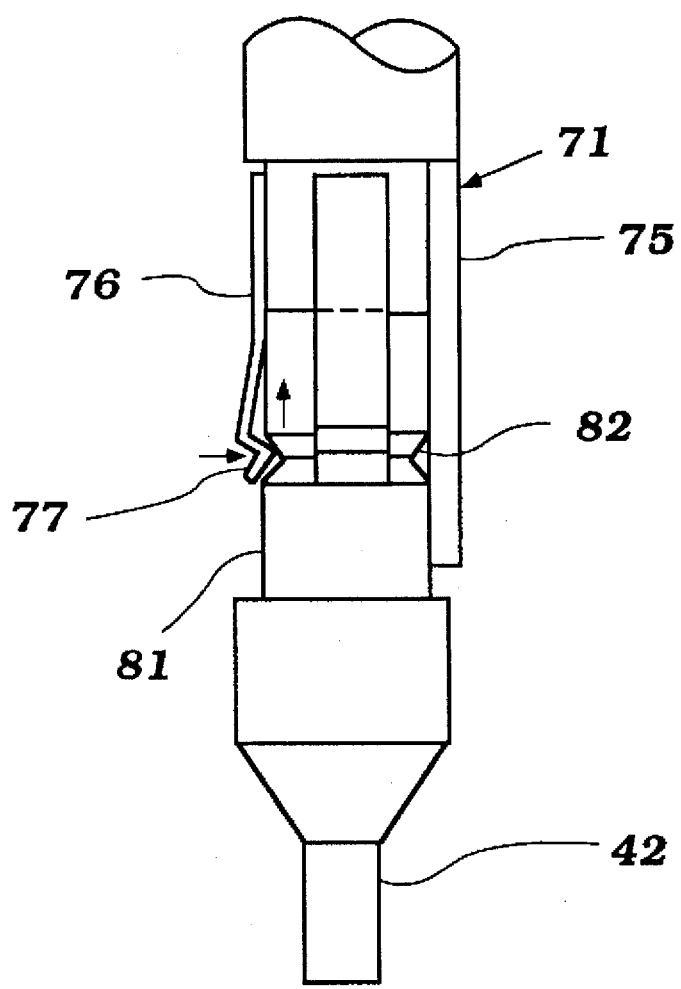
FIG. 14 is a side elevational view showing the pick-up nozzle positioned in the nozzle holding assembly.

Referring now to FIG. 12 through 14 a nozzle holding assembly 71 is disposed on the lower surface of the pick-up head 41 and is comprised of an upper block 72 in which is positioned a cylindrical extension 73 about a pick-up head hole 74. Mounted to the upper block 72 along two adjacent sides is a bidirectional plate 75 having angularly related rigid surfaces. These surfaces are faced by spring clips 76, at whose lower ends are engagement portions 77. The spring clips 76 are affixed to the two remaining adjacent sides of the upper block 72.

The top portion of the pick-up nozzle 42 is formed as an oblong square column 81 in which is cut a recess 82. A hole is bored into the top surface of the pick-up nozzle 42 and extends downwardly throughout the height of the pick-up nozzle 42 to its lower surface.

The pick-up nozzle 42 is inserted into the nozzle holder 71 between the rigid surfaces of the bidirectional plate 75 and the spring clips 76 so that the nozzle holder cylindrical extension 73 sealingly engages the nozzle hole 83 and the engagement portions 77 of the spring clips 76 engage the nozzle recess 82 and tend to push the pick-up nozzle 42 into engagement with the rigid surfaces of the bidirectional plate 75. Thus, it is readily apparent that the pick-up nozzle 42 is precisely and securely attached in a detachable manner to the nozzle holder 71. This ensures the accurate mounting of the cylindrical components 14 onto the substrate 13.

It should be readily apparent from the foregoing description that the described apparatus and method permit very accurate measurement of the pick-up location of articles having cylindrical sections so that they can be accurately positioned. In addition, the arrangement avoids the likelihood of false readings because of reflections from the pick-up device, and also permits changing of the pick-up devices without interfering with the accurate placement.

It will, of course, be readily apparent to those skilled in the art that the described apparatus and method are only preferred embodiments of the invention and that various changes and modifications may be made without departing from the spirit and scope of the invention, as defined by the appended claims.

What is claimed is:

1. An apparatus for picking up and positioning articles having at least one cylindrical section at an accurate location, said apparatus being comprised of a pick-up device rotatable about an axis and movable in the X, Y, and Z directions to manipulate a picked up article, said pick-up device being adapted to releasably hold the article, means for taking a first measurement of the cylindrical section of the article when held by said pick-up device in a first angular position, means for rotating said pick-up device and the held article through a predetermined angle and for taking a second measurement of said cylindrical section in the second angular position, and means for calculating X, Y, and rotational offsets for calculating a corrective factor indicative of the offset of the article relative to the pick-up device for accurate positioning thereof.

2. An apparatus for picking up and positioning articles as in claim 1, wherein the measurements are the measurement of the width of the cylindrical section of the article in each of the angular positions and the center of the cylindrical section in each of the angular positions.

3. An apparatus for picking up and positioning articles as in claim 2, wherein the measurements further include measuring of the offset of the center of the cylindrical section of the article from the center of the pick-up device in each of the angular positions.

4. An apparatus for picking up and positioning articles as in claim 3, wherein the offsets in the two angular positions are converted into X and Y offsets by trigonometric relationships.

5. An apparatus for picking up and positioning articles as in claim 2, wherein the measurements of the width of the cylindrical section in each of the angular positions are also compared with the known diameter of the cylindrical section to determined if the article has been picked up properly.

6. An apparatus for picking up and positioning articles as in claim 4, wherein the predetermined angle comprises 90 degrees.

7. An apparatus for picking up and positioning articles as in claim 1, wherein the measurement of the cylindrical section is made continuously during the entire rotation between the first and second angular positions.

8. An apparatus for picking up and positioning articles as in claim 7, wherein the measurement of the cylindrical section comprises a width measurement.

9. An apparatus for picking up and positioning articles as in claim 8, wherein the width measurement is utilized to calculate the center of the cylindrical object.

10. An apparatus for picking up and positioning articles as in claim 9, wherein the center of the cylindrical object relative to the center of the pick-up device is calculated to determine the corrective factors.

11. An apparatus for picking up and positioning articles as in claim 10, wherein the predetermined angle comprises 180 degrees.

12. An apparatus for picking up and positioning articles as in claim 1, wherein the measurements are taken by an optical device.

13. An apparatus for picking up and positioning articles as in claim 12, wherein the optical device comprises a laser light source providing a series of light rays and a receptor on which a shadow is cast by the cylindrical section of the article.

14. An apparatus for picking up and positioning articles as in claim 13, wherein the pick-up device is treated so that it will not reflect light.

15. An apparatus for picking up and positioning articles as in claim 1, wherein the pick-up device is detachably connected to a head supported for movement in the X, Y, and Z directions so as to permit replacement of the pick-up device.

16. An apparatus for picking up and positioning articles as in claim 15, wherein the detachable connection to the head is provided by a holder.

17. An apparatus for picking up and positioning articles as in claim 16, wherein the holder is configured to have a pair of angularly disposed rigid surfaces engagable with cooperating rigid surfaces of the pick-up device and further including a pair of spring clips, each associated with a one of said rigid surfaces and engagable with a recess in the pick-up device for holding the pick-up device surfaces against the holder surfaces and for retaining the position of the pick-up device in a transverse direction.

18. A method for picking up and positioning articles having at least one cylindrical section at an accurate location utilizing an apparatus comprised of a pick-up device rotatable about an axis and movable in the X, Y, and Z directions to manipulate a picked up article, said pick-up device being adapted to releasably hold the article, said method comprising the steps of taking a first measurement of the cylindrical section of the article when held by said pick-up device in a first angular position, rotating said pick-up device and the held article through a predetermined angle and taking a second measurement of said cylindrical section in the second angular position, and calculating X, Y, and rotational offsets for calculating a corrective factor indicative of the offset of the article relative to the pick-up device for accurate positioning thereof.

19. A method for picking up and positioning articles as in claim 18, wherein the measurements are the measurement of the width of the cylindrical section of the article in each of the angular positions and the location of the center of the cylindrical section in each of the angular positions.

20. A method for picking up and positioning articles as in claim 19, wherein the measurements further include measuring of the offset of the center of the cylindrical section of the article from the center of the pick-up device in each of the angular positions.

21. A method for picking up and positioning articles as in claim 20, wherein the offsets in the two angular positions are converted into X and Y offsets by trigonometric relationships.

22. A method for picking up and positioning articles as in claim 19, wherein the measurements of the width of the cylindrical section in each of the angular positions are also compared with the known diameter of the cylindrical section to determined if the article has been picked up properly.

23. A method for picking up and positioning articles as in claim 21, wherein the predetermined angle comprises 90 degrees.

24. A method for picking up and positioning articles as in claim 18, wherein the measurement of the cylindrical section is made continuously during the entire rotation between the first and second angular positions.

25. A method for picking up and positioning articles as in claim 24, wherein the measurement of the cylindrical section comprises a width measurement.

26. A method for picking up and positioning articles as in claim 25, wherein the width measurement is utilized to calculate the center of the cylindrical object.

27. A method for picking up and positioning articles as in claim 26, wherein the center of the cylindrical object relative to the center of the pick-up device is calculated to determine the corrective factors.

28. A method for picking up and positioning articles as in claim 27, wherein the predetermined angle comprises 180 degrees.

29. A method for picking up and positioning articles as in claim 18, wherein the measurements are taken by an optical device.

30. A method for picking up and positioning articles as in claim 29, wherein the optical device comprises a laser light source providing a series of light rays and a receptor on which a shadow is cast by the cylindrical section of the article.

31. A method for picking up and positioning articles as in claim 30, wherein the pick-up device is treated so that it will not reflect light.

\* \* \* \* \*